(12) United States Patent
Lee et al.

(10) Patent No.: US 9,496,054 B1
(45) Date of Patent: Nov. 15, 2016

(54) DRIVING TEST CIRCUIT AND SEMICONDUCTOR DEVICE INCLUDING THE SAME

(71) Applicant: SK hynix Inc., Icheon-si Gyeonggi-do (KR)

(72) Inventors: Sung Yub Lee, Icheon-si (KR); Sung Soo Chi, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/054,388

(22) Filed: Feb. 26, 2016

(30) Foreign Application Priority Data

Aug. 21, 2015 (KR) ........................ 10-2015-0117928

(51) Int. Cl.
*G11C 11/34* (2006.01)
*G11C 29/50* (2006.01)

(52) U.S. Cl.
CPC ..................................... *G11C 29/50* (2013.01)

(58) Field of Classification Search
CPC .................................. G11C 8/00; G11C 8/10

USPC ........................................ 365/185.23, 230.06
See application file for complete search history.

(56) References Cited

U.S. PATENT DOCUMENTS

| 8,520,463 | B2* | 8/2013 | Sumitani | G11C 8/08 |
| | | | | 365/230.03 |
| 2010/0165724 | A1* | 7/2010 | Pellizzer | G11C 8/08 |
| | | | | 365/163 |
| 2010/0188886 | A1* | 7/2010 | Behrends | G11C 8/08 |
| | | | | 365/154 |

FOREIGN PATENT DOCUMENTS

KR   1020140006287 A   1/2014

* cited by examiner

*Primary Examiner* — Han Yang
(74) *Attorney, Agent, or Firm* — William Park & Associates Ltd.

(57) ABSTRACT

Disclosed is a driving test circuit including a driving circuit that drives a sub-word line based on a first voltage and a driving signal, and a test element circuit that adds a resistance component between the driving circuit and the first voltage based on a test mode signal.

17 Claims, 6 Drawing Sheets

DRIVING TEST CIRCUIT AND SEMICONDUCTOR DEVICE INCLUDING THE SAME

CROSS-REFERENCES TO RELATED APPLICATION

The present application claims priority under 35 U.S.C. §119(a) to Korean application number 10-2015-0117928, filed on Aug. 21, 2015, in the Korean Intellectual Property Office, which is incorporated herein by reference in its entirety.

BACKGROUND

1. Technical Field

Various embodiments relate to a driving test circuit and a semiconductor device including the same.

2. Related Art

A semiconductor device operates by driving a memory cell connected to a plurality of word lines and a bit line crossing the plurality of word lines.

However, due to resistance components which may be included in the word lines and the bit line, a voltage applied to each word line and the bit line is not normally provided to other elements. When voltage is not provided to the other elements, an operation involving a memory cell is not performed. Operations involving a memory cell include operations in which charge is provided to the memory cell and data is written to the memory cell, or the charge is read from the memory cell and the data is read out.

Accordingly, there is a need to determine the presence of memory cells, which are expected to perform an abnormal operation, by detecting (screening) the resistance components of the word lines and the bit line.

SUMMARY

Various embodiments are directed to a driving test circuit and a semiconductor device including the same, which can allow resistance components having different resistances to be connected to a driving path of a word line according to an operation mode, and to determine a range in which a normal operation is possible according to a size of a resistance component connected to the driving path of the word line, thereby indirectly testing whether the word line can operate normally.

In an embodiment, a driving test circuit may include a driving circuit that drives a sub-word line on a basis of a first voltage and a driving signal; and a test element circuit that adds a resistance component between the driving circuit and the first voltage on a basis of a test mode signal.

In an embodiment, a driving test circuit may include a plurality of driving circuits that respectively drive a plurality of sub-word lines connected to a main word line on a basis of a first voltage; and a test element circuit that is connected between the plurality of driving circuits and a path through which the first voltage is applied, and selectively adds a resistance component on a basis of a test mode signal.

In an embodiment, a semiconductor device may include a test element circuit that is positioned in an X hole, adds different resistance components to a path, through which a first voltage is provided, in response to a test mode signal, and provides a test voltage; and a plurality of driving circuit units that drive sub-word lines in response to the test voltage provided from the test element circuit.

According to the embodiments, the driving test circuit and the semiconductor device including the same can test failure of a word line to determine a memory cell which operates normally, and not requiring separate test equipment.

According to the embodiments, in the driving test circuit and the semiconductor device including the same, elements required for a test are concentrated at one position, so that it is possible to minimize an area required for a test.

DETAILED DESCRIPTION

Hereinafter, a driving test circuit and a semiconductor device including the same will be described below with reference to the accompanying drawings through various examples of embodiments.

Figure 1:
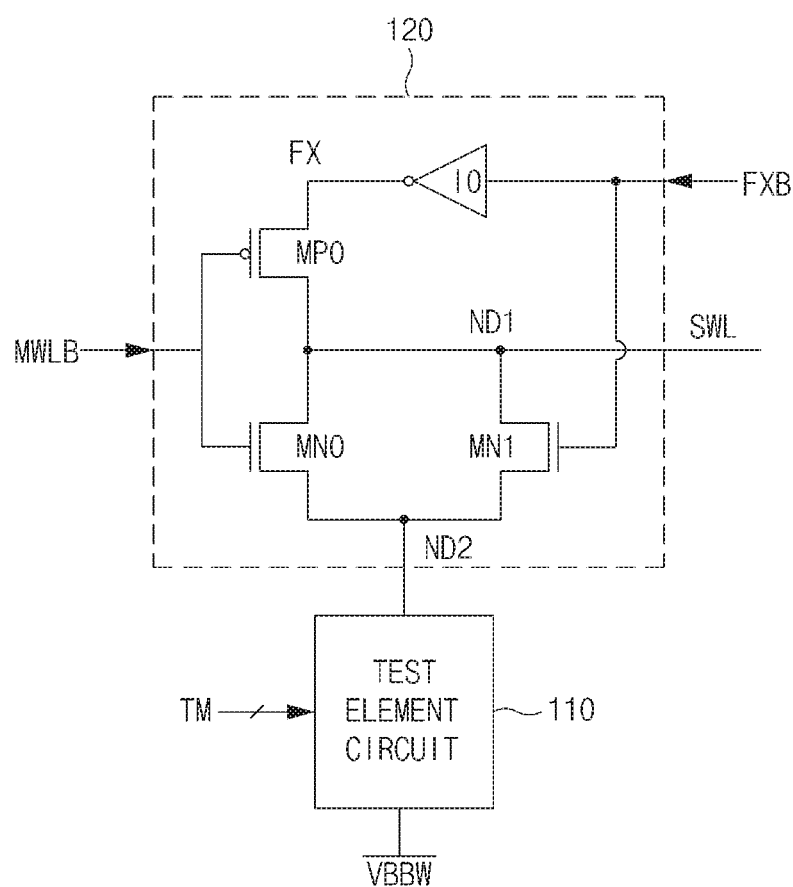
FIG. 1 is a diagram illustrating a driving test circuit according to an embodiment

FIG. 1 is a diagram illustrating a driving test circuit according to an embodiment.

Referring to FIG. 1, a driving test circuit 100 may include a test element circuit 110 and a driving circuit 120.

The test element circuit 110 may include at least one test element. The test element adds different resistance components to the driving circuit 120 in response to a test mode signal TM. The test element will be described in detail with reference to FIG. 2 and FIG. 3.

The test element circuit 110 is connected between a first voltage VBBW and a second node ND2, and adds a resistance component between the first voltage VBBW and the second node ND2 of the driving circuit 120. The first voltage VBBW may be changed to different voltages according to the resistance component added by the test element circuit 110, and the changed first voltage VBBW may be provided to the second node ND2.

According to embodiments, when the driving test circuit 100 performs a normal operation instead of a test operation, the first voltage VBBW may be provided to the second node ND2 as is.

However, in the test operation, the test element circuit 110 adds different resistance components between the first voltage VBBW and the second node ND2 based on the test mode signal TM.

For example, the first voltage VBBW may correspond to a back bias voltage.

The driving circuit 120 provides a driving voltage to a sub-word line SWL in response to a complementary main word line driving signal MWLB and a complementary sub-word line driving signal FXB.

The driving circuit 120 may include a first PMOS transistor MP0, a first NMOS transistor MN0, and a second NMOS transistor MN1.

The first PMOS transistor MP0 may include a first terminal for receiving a sub-word line driving signal FX, a gate terminal for receiving the complementary main word line driving signal MWLB, and a second terminal connected to a first node ND1. The sub-word line driving signal FX received by the first PMOS transistor MP0 may be obtained by inverting the complementary sub-word line driving signal FXB.

The first NMOS transistor MN0 may include a first terminal connected to the second node ND2, a gate terminal for receiving the complementary main word line driving signal MWLB, and a second terminal connected to the first node ND1.

The first PMOS transistor MP0 and the first NMOS transistor MN0 may complementarily perform an on/off operation in response to the complementary main word line driving signal MWLB, thereby providing the sub-word line driving signal FX or a voltage of the second node ND2 to the first node ND1.

The second NMOS transistor MN1 includes a first terminal connected to the second node ND2, a gate terminal for receiving the complementary sub-word line driving signal FXB, and a second terminal connected to the first node ND1.

The second NMOS transistor MN1 may provide a voltage of the second node ND2 to the first node ND1 in response to the complementary sub-word line driving signal FXB.

Assuming an ideal operation, the driving circuit 120 may provide the sub-word line driving signal FX or the first voltage VBBW, thereby driving the sub-word line SWL. However, due to a resistance component of the sub-word line SWL and resistance components among the different transistors MP0, MN0, and MN1 connected to the first node ND1, even though a driving voltage is provided to the sub-word line SWL, the driving voltage may not actually be provided to the sub-word line SWL.

Particularly, the sub-word line SWL may have high resistance in terms of fabrication caused by a MOC connection.

Consequently, the driving test circuit 100 according to an embodiment can selectively add a resistance component to the second node ND2 based on the test mode signal TM, thereby confirming whether the sub-word line SWL is operating normally.

In detail, for example, with the driving test circuit 100 even though a resistance component with a predetermined size is connected, when the sub-word line SWL operates normally, the resistance component of the driving circuit 120 may also be in a normal operable range. According to embodiments, a range in which a normal operation is to be performed may be changed. The normal operation may be performed according to the size of a resistance component added by the test element circuit 110.

Figure 2:
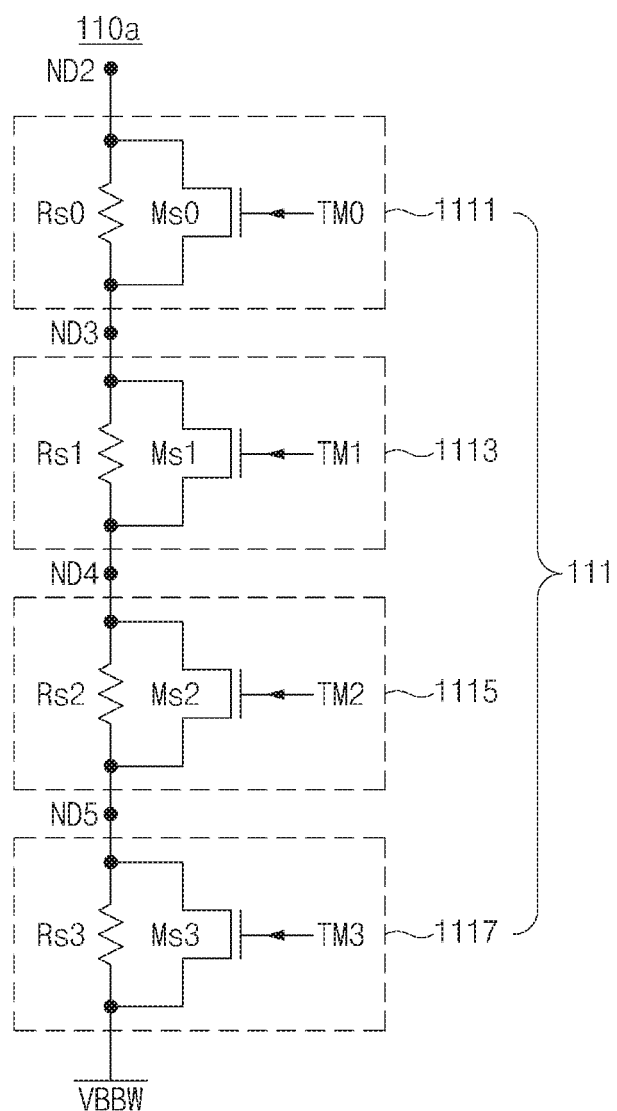
FIG. 2 and FIG. 3 are diagrams illustrating a test element circuit according to an embodiment.

FIG. 2 is a diagram illustrating a test element circuit according to an embodiment.

Referring to FIG. 2, a test element circuit 110a may include a selective resistance component 111 connected between the first voltage VBBW and the second node ND2.

The selective resistance component 111 is an element for selectively adding a resistance component in response to the test mode signal TM. According to embodiments, the selective resistance component 111 may include resistance elements Rs0 to Rs3 and selection transistors Ms0 to Ms3, which are respectively connected in parallel to each other. The selective resistance component 111 may include first to fourth selective resistance components 1111, 1113, 1115, and 1117 serially connected to one another.

The first selective resistance component 1111 may include the first resistance element Rs0 and the first selection transistor Ms0, which are connected in parallel to each other.

When a first test mode bit TM0 included in the test mode signal TM is activated, the first selection transistor Ms0 is turned on, so that the first resistance element Rs0 is not added between a third node ND3 and the second node ND2.

However, when the first test mode bit TM0 is deactivated, the first selection transistor Ms0 is turned off, so that the first resistance element Rs0 is added between the second node ND2 and the third node ND3.

The second selective resistance component 1113 may include the second resistance element Rs1 and the second selection transistor Ms1, which are connected in parallel to each other.

When a second test mode bit TM1 included in the test mode signal TM is activated, the second selection transistor Ms1 is turned on, so that the second resistance element Rs1 is not added between the third node ND3 and a fourth node ND4.

However, when the second test mode bit TM1 is deactivated, the second selection transistor Ms1 is turned off, so that the second resistance element Rs1 is added between the third node ND3 and the fourth node ND4.

The third selective resistance component 1115 may include the third resistance element Rs2 and the third selection transistor Ms2, which are connected in parallel to each other.

When a third test mode bit TM2 included in the test mode signal TM is activated, the third selection transistor Ms2 is turned on, so that the third resistance element Rs2 is not added between the fourth node ND4 and a fifth node ND5.

However, when the second test mode bit TM2 is deactivated, the third selection transistor Ms2 is turned off, so that the third resistance element Rs2 is added between the fourth node ND4 and the fifth node ND5.

The fourth selective resistance component 1117 may include the fourth resistance element Rs3 and the fourth selection transistor Ms3, which are connected in parallel to each other.

When a fourth test mode bit TM3 included in the test mode signal TM is activated, the fourth selection transistor Ms3 is turned on, so that the fourth resistance element Rs3 is not added between the fifth node ND5 and the first voltage VBBW.

However, when the fourth test mode bit TM3 is deactivated, the fourth selection transistor Ms3 is turned off, so that the fourth resistance element Rs3 is added between the fifth node ND5 and the first voltage VBBW.

As described above, the first to fourth selective resistance components 1111, 1113, 1115, and 1117 serially connected to one another may selectively add the resistance elements Rs0 to Rs3 between the first voltage VBBW and the second node ND2 based on the test mode signal TM.

The resistance elements Rs0 to Rs3 may have resistance values which are substantially equal to one another or different from one another. When the resistance elements Rs0 to Rs3 have resistance values different from one another, it is possible to adjust a size of a resistance element added between the second node ND2 and the first voltage VBBW through combinations of sizes of the resistance elements Rs0 to Rs3.

For example, the following description is given on the assumption that the size of the first resistance element Rs0 is 1 KΩ, the size of the second resistance element Rs1 is 2 KΩ, the size of the third resistance element Rs2 is 3 KΩ, and the size of the fourth resistance element Rs3 is 4 KΩ.

When the first test mode bit TM0 is deactivated to turn off the first selection transistor Ms0 and the second to fourth test mode bits TM1 to TM3 are activated to turn on the second to fourth selection transistors Ms1 to Ms3, a resistance element of 1 KΩ is added between the first voltage VBBW and the second node ND2.

When all the first to fourth test mode bits TM0 to TM3 are deactivated to turn off the first to fourth selection transistors Ms0 to Ms3, a resistance element of 10 KΩ is added between the first voltage VBBW and the second node ND2.

As described above, when the test element circuit 110a illustrated in FIG. 2 is provided, the driving test circuit 100 may add resistance elements of 1 KΩ to 10 KΩ with various sizes between the first voltage VBBW and the second node ND2 according to the value of the test mode signal TM.

FIG. 2 illustrates four selective resistance components 1111, 1113, 1115, and 1117 serially connected to one another and describes them; however, embodiments are not limited thereto and the test element circuit 110a may include at least one resistance component. According to embodiments, the selective resistance components 1111, 1113, 1115, and 1117 may have a NMOS transistor or a PMOS transistor with a relatively long length and may also add a resistance element according to a turn-on resistance value of the transistor.

FIG. 2 illustrates that the selection transistors Ms0 to Ms3 have a NMOS transistor; however, embodiments are not limited thereto and if transistors such as a PMOS transistor connects two nodes to each other in response to the test mode signal TM, the transistors may be included in the selection transistors Ms0 to Ms3 described in the embodiments.

Figure 3:
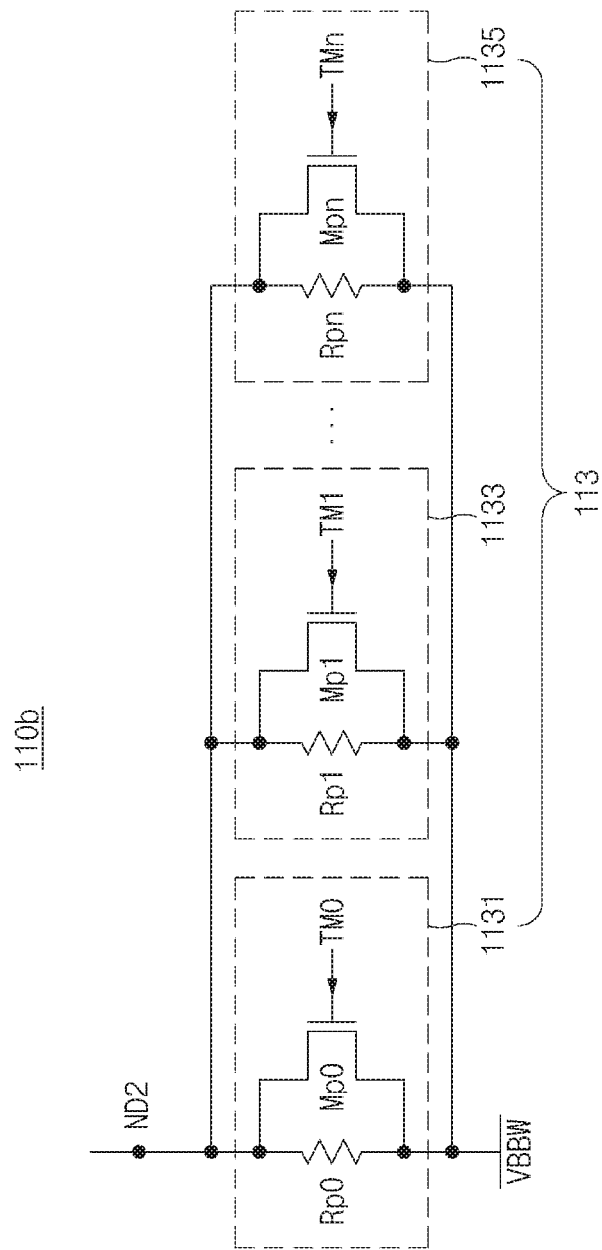

FIG. 3 is a diagram illustrating a test element circuit according to an embodiment.

Referring to FIG. 3, a test element circuit 110b may include at least one selective resistance component 113 which is connected between the second node ND2 and the first voltage VBBW to add a resistance component in response to the test mode signal TM.

The selective resistance component 113 is an element which selectively adds a resistance component in response to the test mode signal TM, wherein each selective resistance component 113 may include resistance elements Rp0, Rp1, ..., Rpn and selection transistors Mp0, Mp1, ..., Mpn, which are respectively connected in parallel to each other. The configuration of each selective resistance component 113, illustrated in FIG. 3, is substantially the same as that of each selective resistance component 111 illustrated in FIG. 2.

However, in the test element circuit 110a of FIG. 2, the selective resistance components 1111, 1113, 1115, and 1117 are serially connected to one another between the second node ND2 and the first voltage VBBW. But in the test element circuit 110b of FIG. 3, selective resistance components 1131, 1133, ..., 1135 are connected in parallel to one another between the second node ND2 and the first voltage VBBW.

Similar to the description of FIG. 2, the selective resistance components 1131, 1133, ..., 1135 may operate in such a manner that the selection transistors Mp0, Mp1, ..., Mpn are turned on in response to test mode signal TM (TM0, TM1, ..., TMn). Further, the resistance elements Rp0, Rp1, ..., Rpn connected in parallel to the selection transistors Mp0, Mp1, ..., Mpn may or may not be added between the second node ND2 and the first voltage VBBW.

The first selective resistance component 1131 may include the first resistance element Rp0 and the first selection transistor Mp0 which are connected in parallel to each other.

When the first test mode signal TM0 included in the test mode signal TM is activated, the first selection transistor Mp0 is turned on, so that the first resistance element Rp0 is not added between the second node ND2 and the first voltage VBBW.

However, when the first test mode bit TM0 is deactivated, the first selection transistor Mp0 is turned off, so that the first resistance element Rp0 is added between the second node ND2 and the first voltage VBBW.

The second selective resistance component 1133 may include the second resistance element Rp1 and the second selection transistor Mp1 which are connected in parallel to each other.

When the second test mode bit TM1 included in the test mode signal TM is activated, the second selection transistor Mp1 is turned on, so that the second resistance element Rp1 is not added between the second node ND2 and the first voltage VBBW.

However, when the second test mode bit TM1 is deactivated, the second selection transistor Mp1 is turned off, so that the second resistance element Rp1 is added between the second node ND2 and the first voltage VBBW.

The $n^{th}$ selective resistance component 1135 may include the $n^{th}$ resistance element Rpn and the $n^{th}$ selection transistor Mpn which are connected in parallel to each other.

In a same manner, when the $n^{th}$ test mode bit TMn included in the test mode signal TM is activated, the $n^{th}$ selection transistor Mpn is turned on, so that the $n^{th}$ resistance element Rpn is not added between the second node ND2 and the first voltage VBBW.

However, when the $n^{th}$ test mode bit TMn is deactivated, the $n^{th}$ selection transistor Mpn is turned off, so that the $n^{th}$ resistance element Rpn is added between the second node ND2 and the first voltage VBBW.

In the test element circuit 110b according to an embodiment, the plurality of selective resistance components 1131, 1133, ..., 1135 connected in parallel to one another may selectively add resistance components between the first voltage VBBW and the second node ND2 based on the test mode signal TM.

The resistance elements Rp0, Rp1, ..., Rpn included in the selective resistance components 1131, 1133, ..., 1135 may have resistance values which are substantially equal to one another or different from one another. The resistance elements Rp0, Rp1, ..., Rpn may also selectively add resistance elements between the second node ND2 and the first voltage VBBW according to various combinations of the test mode bits included in the test mode signal TM.

As described above, the resistance elements Rp0, Rp1, ..., Rpn may include a NMOS transistor or a PMOS transistor having a relatively long length and may also serve as a resistance component according to turn-on resistance of the transistor.

For example, the following description will be given assuming that the size of the first resistance element Rp0 is 2 KΩ, the size of the second resistance element Rp1 is 4 KΩ, and the size of the $n^{th}$ resistance element Rpn is 8 KΩ.

When the first test mode bit TM0 is deactivated to turn on the first selection transistor Mp0 and the second and $n^{th}$ test mode bits TM1 and TMn are deactivated to turn off the second and $n^{th}$ selection transistors Mp1 and Mpn, a resistance element of 8/3 $(=\frac{1}{4}+\frac{1}{8})^{-1}$ KΩ is added between the first voltage VBBW and the second node N D2.

In the test element circuits 110a and 110b illustrated in FIG. 2 and FIG. 3, the size of a resistance component connected between a first node and the second node ND2 may be changed in response to the test mode signal TM, where the first voltage VBBW is applied to the first node. Accordingly, a voltage provided to the second node ND2 may be changed based on a resistance applied by the test element circuits 110a and 110b. The value of a specific voltage provided to the second node ND2 is obtained by artificially adding a resistance component in a normal operation process.

When the sub-word line SWL operates normally regardless of the voltage value of the second node ND2 provided by intentionally adding a resistance component, it may be determined that the sub-word line SWL operates normally by a resistance component generated by the sub-word line SWL or other elements.

Figure 4:
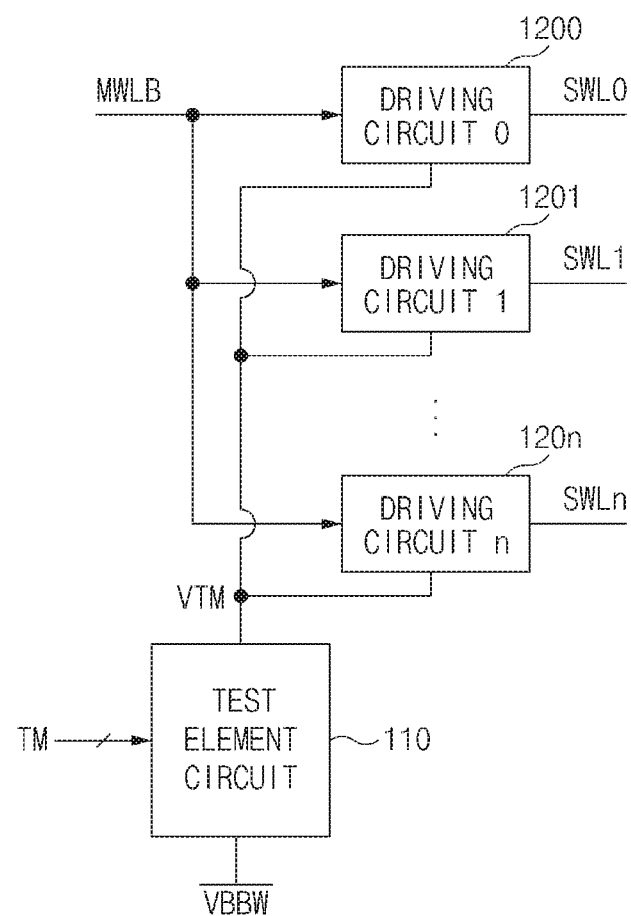
FIG. 4 is a block diagram illustrating a driving test circuit according to an embodiment.

FIG. 4 is a diagram illustrating a driving test circuit according to an embodiment of the present invention.

Referring to FIG. 4, a driving test circuit 100b may include a plurality of driving circuits 1200, 1201, . . . , 120n and a test element circuit 110 connected between the plurality of driving circuits 1200, 1201, . . . , 120n and the a path through which the first voltage VBBW is applied.

In the driving test circuit 100b, a plurality of sub-word lines SWL0, SWL1, . . . , SWLn may be connected to and driven based on one complementary main word line driving signal MWLB.

According to embodiments, four or eight sub-word lines may be driven based on one complementary main word line driving signal MWLB according to a row decoding scheme.

Since the plurality of driving circuits 1200, 1201, . . . , 120n have substantially the same configuration as that of the driving circuit 120 illustrated in FIG. 1, a detailed description thereof will be omitted.

The driving test circuit 100b according to an embodiment of the present invention may test the plurality of driving circuits 1200, 1201, . . . , 120n by one test element circuit 110. The test element circuit 110 may add different resistance components based on the test mode signal TM and supply a test voltage VTM to the plurality of driving circuits 1200, 1201, . . . , 120n.

The test voltage VTM has a value corresponding to the voltage of the second node ND2 described with reference to FIG. 1 to FIG. 3, and the size of the test voltage VTM value may be changed according to a resistance component of the test element circuit 110.

The test element circuit 110 may include the test element circuits 110a and 110b as illustrated in FIG. 2 and FIG. 3. The test element circuit 110 may serve as different resistance components based on the test mode signal TM, thereby adjusting the size of the test voltage VTM.

As described above, the test voltage VTM is an index for determining whether the sub-word lines SWL0, SWL1, . . . , SWLn have predetermined resistance components.

For example, although the test voltage VTM has a value similar to the first voltage VBBW, the sub-word lines SWL0, SWL1, . . . , SWLn may possibly not operate normally. In this case, the test element circuit 110 does not add a resistance component. When the sub-word lines SWL0, SWL1, . . . , SWLn do not operate normally although the test voltage VTM has a value similar to the first voltage VBBW, it may be determined that resistance components of the corresponding sub-word lines SWL0, SWL1, . . . , SWLn or resistance components of the driving circuits 1200, 1201, . . . , 120n connected to the corresponding sub-word lines SWL0, SWL1, . . . , SWLn do not correspond to a normal range.

The driving test circuit 100b according to an embodiment may control resistance components of the plurality of driving circuits 1200, 1201, . . . , 120n and the plurality of sub-word lines SWL0, SWL1, . . . , SWLn using the test mode signal TM through one test element circuit 110, thereby testing the plurality of driving circuits 1200, 1201, . . . , 120n.

Consequently, it is possible to minimize an area separately required for a test, and the test mode signal TM is controlled without changing a configuration of the test and resistance components of various sizes are added, so that it is possible to control a size of the test voltage VTM and thus to easily change the test method.

Figure 5:
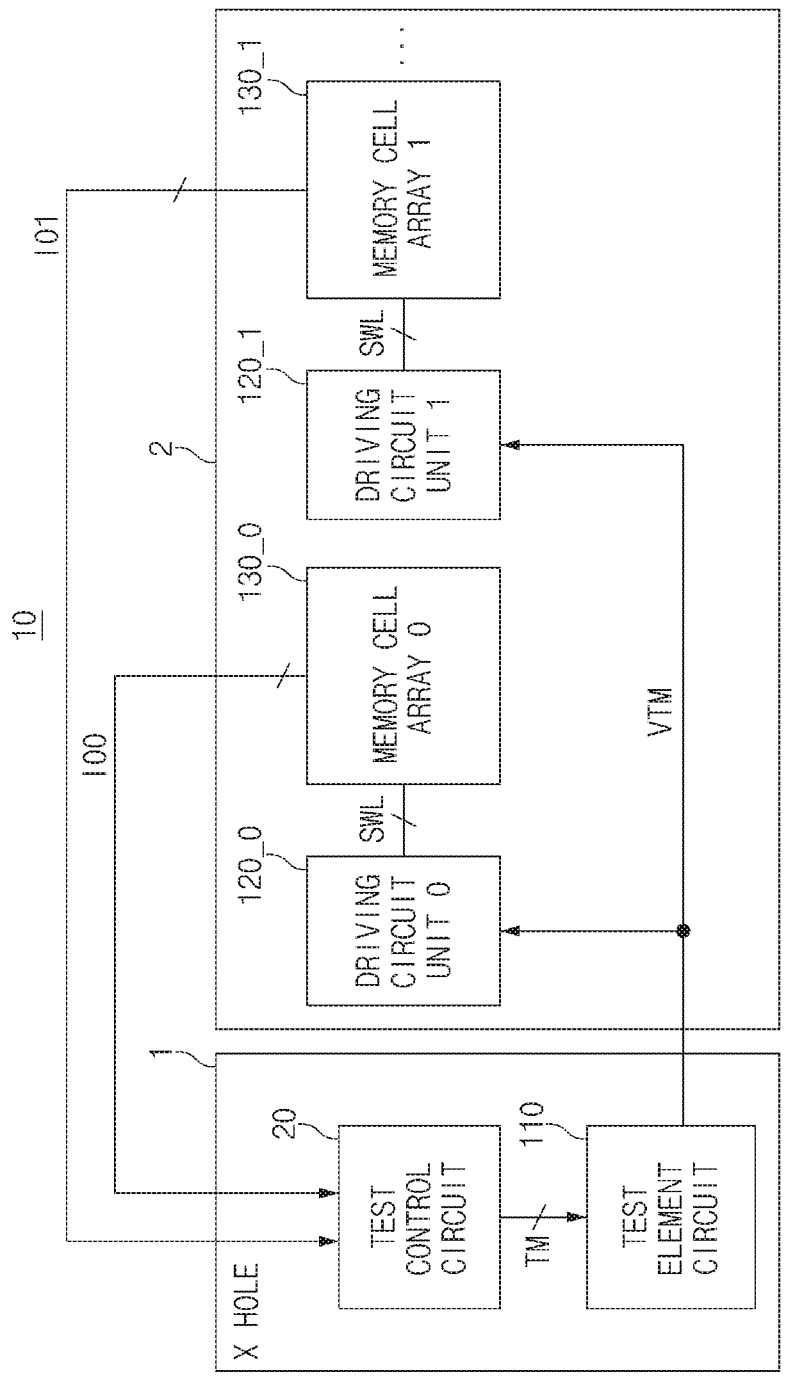
FIG. 5 is a block diagram illustrating a semiconductor device according to an embodiment.

FIG. 5 is a block diagram illustrating a semiconductor device according to an embodiment.

Referring to FIG. 5, a semiconductor device 10 may include an X hole 1 and a memory unit 2.

The X hole 1 includes circuits which generate control signals for controlling the driving of a word line of a memory cell array. For example, the semiconductor device 10 according to an embodiment of the present invention may include at least a row decoder, a main word line driving circuit in the X hole 1.

The X hole 1 may include the test element circuit 110 and a test control circuit 20. The test control circuit 20 may generate the test mode signal TM to be provided to the test element circuit 110 and provide the test mode signal TM to the test element circuit 110.

The test control circuit 20 generates the test mode signal TM to control the size of the test voltage VTM provided by the test element circuit 110 to driving circuit units 120_0, 120_1, . . . , in other words, the size of a resistance component added to the second node (ND2, see FIG. 1 and FIG. 2) connected to the driving circuit units 120_0 and 120_1.

The test control circuit 20 may test whether each element failed based on input/output data IO0, IO1, . . . , received from the memory unit 2. In the case where the test element circuit 110 has a preset resistance component based on the test mode signal TM, when the sub-word line SWL is normally driven, the corresponding sub-word line SWL may be determined to pass; and when the sub-word line SWL is not normally driven, the corresponding sub-word line SWL may be determined to fail.

According to embodiments, the test control circuit 20 may control the test mode signal TM to gradually increase the size of the resistance component added by the test element circuit 110, thereby determining a ratio of the sub-word line SWL which operates normally operates.

As the resistance component of the test element circuit 110 becomes large, the ratio of the sub-word line SWL, which is operating normally, may be reduced. The test control circuit 20 may also set an operation voltage in a range in which the sub-word line SWL operates normally by a specific ratio.

The memory unit 2 may include the plurality of driving circuit units 120_0, 120_1, . . . , and a plurality of memory cell arrays 130_0 and 130_1, . . . . Each of the driving circuit units 120_0, 120_1, . . . , may include a plurality of driving circuits 120 and each of the memory cell arrays 130_0 and 130_1, . . . , may include a plurality of memory cells. Each of the memory cell arrays 130_0 and 130_1, . . . may be connected to a sub-word line SWL of at least one driving circuit unit 120_0, 120_1, . . . .

The plurality of driving circuits 120 included in the driving circuit units 120_0, 120_1, . . . , may provide a driving voltage to the sub-word line SWL based on the test mode signal TM. In other words, in one example, the plurality of driving circuits 120 included in the driving circuit units 120_0, 120_1, . . . , may provide a driving voltage to the sub-word line SWL based on a complementary main word line driving signal MWLB, a complementary sub-word line driving signal FXB, and the test voltage VTM (see FIG. 4). The test control circuit 20 may read the input/output data IO0, IO1, . . . , from the memory cell arrays 130_0 and 130_1, . . . , according to the driving voltage provided to the sub-word line SWL.

The input/output data IO0, IO1, . . . , provided to the test control circuit 20 included in the X hole 1, serves as a base for determining whether the sub-word line SWL has been driven normally.

To determine whether the sub-word line SWL has been driven normally based on the input/output data IO0, IO1, . . . , a test pattern may be stored in advance in the memory cell arrays 130_0 and 130_1, . . . .

The test control circuit 20 according to an embodiment may detect the voltage of the sub-word line SWL of the memory cell arrays 130_0 and 130_1, . . . , thereby determining whether the sub-word line SWL operates normally. For example, when the sub-word line SWL has a preset voltage level or more based on the complementary main word line driving signal MWLB and the complementary sub-word line driving signal FXB, the test control circuit 20 may determine that the sub-word line SWL operates normally.

As described above, the driving test circuits 100 and 100b and the semiconductor device 10 including the driving test circuit according to an embodiment add different resistance elements between the first voltage VBBW and the driving circuit 120 based on the test mode signal TM. Resistance elements are artificially added to test whether the sub-word line SWL operates normally, so that it is possible to determine whether the sub-word line SWL may operate normally when the resistance elements applied by the test element circuit 110 have been removed.

While various embodiments have been described above, it will be understood to those skilled in the art that the embodiments described are by way of example only. Accordingly, the driving test circuit and the semiconductor device including the same described herein should not be limited based on the described embodiments.

Figure 6:
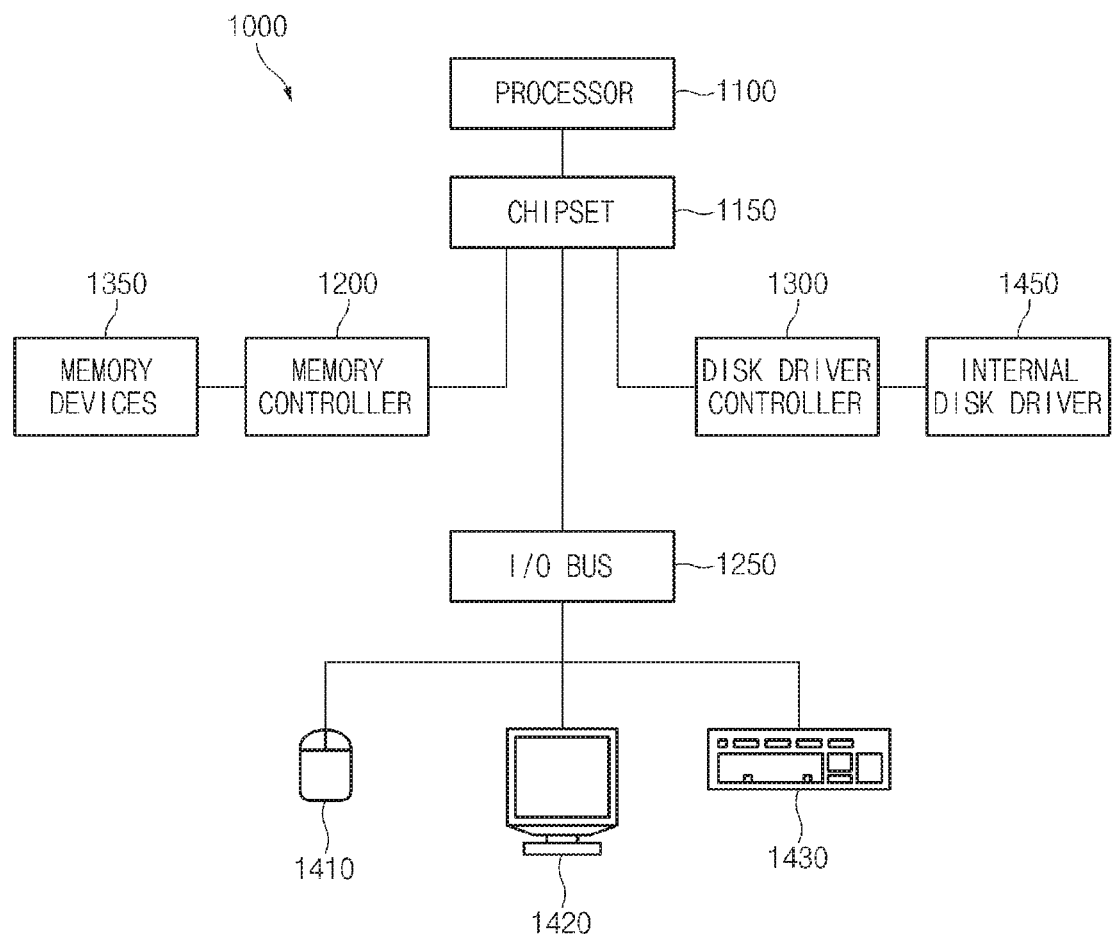
FIG. 6 is block diagram illustrating an example of a representation of a system employing a semiconductor device in accordance with the various embodiments discussed above with relation to FIGS. 1-5.

The driving test circuit (see FIGS. 1-5) are particularly useful in the design of memory devices, processors, and computer systems. For example, referring to FIG. 6, a block diagram of a system employing a driving test circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one driving test circuit as discussed above with reference to FIGS. 1-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, at least one of the processor 1100, memory devices 1350, memory controller 1200, disk drive controller 1300 and internal disk drive 1450 may include the at least one driving test circuit as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a system 1000 employing a driving test circuit as discussed above with relation to FIGS. 1-5. In alternate embodiments, such as, for example but not limited to, cellular phones or digital cameras, the components may differ from the embodiments illustrated in FIG. 6.

What is claimed is:

1. A driving test circuit comprising:
a driving circuit that drives a sub-word line based on a first voltage and a driving signal; and
a test element circuit that adds a resistance component between the driving circuit and the first voltage based on a test mode signal,
wherein the test element circuit includes resistance elements, and a selection transistor which is connected in parallel to the resistance elements and is turned on in response to the test mode signal.

2. The driving test circuit of claim 1, wherein the test element circuit includes at least one selective resistance component which is connected between a first node, to which the first voltage is applied, and a second node connected to the driving circuit, and adds the resistance elements in response to the test mode signal.

3. The driving test circuit of claim 2, wherein a plurality of selective resistance components are connected in series or in parallel to one another between the first node and the second node.

4. The driving test circuit of claim 3, wherein the plurality of selective resistance components include the resistance elements having substantially a same resistance value.

5. The driving test circuit of claim 3, wherein the plurality of selective resistance components include the resistance elements having resistance values different from one another.

6. The driving test circuit of claim 1, wherein the driving circuit includes a sub-word line driving circuit which drives the sub-word line on a basis of a complementary main word line driving signal and a complementary sub-word line driving signal.

7. A driving test circuit comprising:
a plurality of driving circuits that respectively drive a plurality of sub-word lines connected to a main word line based on a first voltage; and
a test element circuit that is connected between the plurality of driving circuits and a path through which the first voltage is applied, and selectively adds a resistance component based on a test mode signal,
wherein the test element circuit includes resistance elements, and a selection transistor which is connected in parallel to the resistance elements and is turned on in response to the test mode signal.

8. The driving test circuit of claim 7, wherein the test element circuit includes at least one selective resistance component which is connected between a first node, to which the first voltage is applied, and a second node connected to the driving circuit, and adds the resistance elements in response to the test mode signal.

9. The driving test circuit of claim 8, wherein a plurality of selective resistance components are connected in series or in parallel to one another between the first node, to which the first voltage is applied, and the second node connected to the driving circuit.

10. The driving test circuit of claim 9, wherein the plurality of selective resistance components include the resistance elements having substantially a same resistance value.

11. The driving test circuit of claim 9, wherein the plurality of selective resistance components include the resistance elements having resistance values different from one another.

12. The driving test circuit of claim 7, wherein the first voltage includes a back bias voltage VBBW.

13. A semiconductor device comprising:
a test element circuit that is positioned in an X hole, adds different resistance components to a path in response to a test mode signal, through which a first voltage is provided through the path, and provides a test voltage; and
a plurality of driving circuit units that drive sub-word lines in response to the test voltage provided from the test element circuit,
wherein the test element circuit includes resistance elements, and a selection transistor which is connected in parallel to the resistance elements and is turned on in response to the test mode signal.

14. The semiconductor device of claim 13, wherein each of the plurality of driving circuit units includes a plurality of driving circuits which drive the sub-word line based on a complementary main word line driving signal, a complementary sub-word line driving signal, and the test voltage.

15. The semiconductor device of claim 13, wherein the test element circuit includes at least one selective resistance component which is connected between a node, to which the first voltage is applied, and a node to which the test voltage is provided, and adds resistance elements in response to the test mode signal.

16. The semiconductor device of claim 13, further comprising:
a test control circuit that generates the test mode signal and determines whether the driving circuit units operate normally.

17. The semiconductor device of claim 13, wherein the semiconductor device comprises:
a plurality of memory cell arrays connected to the sub-word lines of the plurality of driving circuit units.

* * * * *